(12) United States Patent
Rathsack et al.

(10) Patent No.: US 8,449,293 B2
(45) Date of Patent: May 28, 2013

(54) SUBSTRATE TREATMENT TO REDUCE PATTERN ROUGHNESS

(75) Inventors: Benjamin M. Rathsack, Austin, TX (US); Steven Scheer, Austin, TX (US); Mark H. Somervell, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 337 days.

(21) Appl. No.: 12/771,233

(22) Filed: Apr. 30, 2010

(65) Prior Publication Data

US 2011/0269078 A1    Nov. 3, 2011

(51) Int. Cl.
*G03F 7/09* (2006.01)
*G03F 7/11* (2006.01)

(52) U.S. Cl.
CPC . *G03F 7/09* (2013.01); *G03F 7/092* (2013.01)
USPC ............... 431/326; 430/271.1; 430/272.1; 430/330; 430/512; 430/513

(58) Field of Classification Search
CPC ....................................... G03F 7/09; G03F 7/11
USPC .................. 430/271.1, 272.1, 326, 330, 512, 430/513
See application file for complete search history.

(56) References Cited

U.S. PATENT DOCUMENTS

| | | | |
|---|---|---|---|
| 6,208,014 B1 | 3/2001 | Wu et al. | |
| 7,175,944 B2 | 2/2007 | Yin et al. | |
| 7,270,917 B2 | 9/2007 | Yin et al. | |
| 7,534,352 B2 | 5/2009 | Chen et al. | |
| 2004/0248034 A1 | 12/2004 | Henderson et al. | |
| 2006/0177772 A1* | 8/2006 | Abdallah et al. | 430/311 |
| 2007/0105040 A1* | 5/2007 | Toukhy et al. | 430/270.1 |
| 2007/0190459 A1* | 8/2007 | Hashimoto et al. | 430/270.1 |
| 2009/0087996 A1 | 4/2009 | Chi et al. | |
| 2009/0291389 A1 | 11/2009 | Allen et al. | |
| 2010/0009131 A1 | 1/2010 | Basker et al. | |
| 2010/0062364 A1 | 3/2010 | Dazai et al. | |

OTHER PUBLICATIONS

Wood II et al., Initial experience establishing a EUV baseline lithography process for manufacturability assessment, Emerging Lithographic Technologies XI (2007), Proc. of SPIE vol. 6517, 9 pages.
Xu et al, Underlayer designs to enhance the performance of EUV resists, Advances in Resist Materials and Processing Technology XXVI (2009), Proc. of SPIE vol. 7273-72731J, 11 pages.
Bjorkholm et al., EUV Lithography—The Successor to Optical Lithography?, Intel Technology Journal Q3 (1998), Advanced Lithography Dept, Technology and Manufacturing Group, Santa Clara, CA, 8 pages.
Cornell Nanoscale Science and Technology Facility, Photolithography Resist Processes and Capabilities, Cornell University, 7 pages. http://www.cnf.cornell.edu/cnf_process_photo_resists.html.

* cited by examiner

*Primary Examiner* — John Chu
(74) *Attorney, Agent, or Firm* — Wood, Herron & Evans, LLP

(57) ABSTRACT

A method for patterning a substrate with extreme ultraviolet (EUV) radiation is provided. The method includes contacting a surface of the substrate with at least one surface modification agent that reacts with and bonds to the surface 402 of the substrate 401 to provide a modified surface. A layer of photoresist is formed on the modified surface, followed by exposing the layer of photoresist to a pattern of EUV radiation. The surface modification agent has a general formula: X-L-Z, where X is a leaving group; L is a linkage group including a substituted or un-substituted carbon chain having 1 to 20 carbons, a sulfur moiety, a silicon moiety, or combinations thereof; and Z is at least one of an acid functional group, a photoactive acid generator group or a halide.

20 Claims, 4 Drawing Sheets

SUBSTRATE TREATMENT TO REDUCE PATTERN ROUGHNESS

FIELD OF THE INVENTION

The invention relates to methods of patterning a substrate. In particular, the invention relates to a method of reducing critical dimension roughness in extreme ultraviolet lithography (EUVL).

BACKGROUND OF THE INVENTION

The need to remain competitive in cost and performance in the production of semiconductor devices has caused a continuous increase in device density of integrated circuits. To accomplish higher integration and miniaturization in a semiconductor integrated circuit, miniaturization of a circuit pattern formed on a semiconductor wafer must also be accomplished.

A basic photolithographic process, which is the standard technique utilized to manufacture semiconductor wafers, includes projecting a patterned light source onto a layer of photo-reactive or radiation sensitive material, such as a layer of photoresist, which is then followed by a development step. The minimum feature size that a projection system can print is given approximately by:

$$CD = k_1 \cdot \lambda / N_A$$

where CD is the minimum feature size or the critical dimension; $k_1$ is a coefficient that encapsulates process-related factors; $\lambda$ is the wavelength of light used; and $N_A$ is the numerical aperture of the lens, as seen from the semiconductor wafer. In pursuit of reduced critical dimensions, increasing the numerical aperture $N_A$ of exposure systems and/or increasing the coefficient $k_1$ facilitates reduced feature size CD. However, reducing the minimum feature size CD through such efforts has its technological challenges. Thus, exploiting light sources that provide reduced wavelengths, such as in the extreme ultraviolet (EUV) range, is another approach that is currently receiving much attention.

Extreme ultraviolet lithography (EUVL) with an imaging wavelength at 13.5 nm is an attractive solution for realizing the reduction in critical dimensions in semiconductors. However, obstacles have been encountered that have kept EUVL from becoming useful in high volume manufacturing.

One obstacle is critical dimension roughness in the developed layer of photoresist. When defining lines with small widths or critical dimensions (CD) and close pitch distances, variations that occur in patterning such features become problematic due to the small size and closeness of features. One such variation, known as "line width roughness" (LWR), is a deviation in the width or CD of a line feature due to a variation in peak-to-valley amplitude of a non-uniform line edge along its length.

Two basic types of defects are associated with LWR. The first defect is a failure to remove all of the photoresist material from the surface of the underlying layer, leaving a "photoresist scum" that can cause fabrication failures. The second defect, called "footing", is the retention of photoresist material along the edges of the exposed photoresist, decreasing the width of the openings in the pattern. Attempts at using EUV radiation to image a layer of photoresist that is directly applied to a substrate have encountered increased LWR, (i.e., both scumming and footing). In an effort to improve this critical dimension roughness, one approach has been to utilize an organic under-layer, which has provided some improvement. At certain EM wavelengths, such as 365 nm, 248 nm and 193 nm, under-layers, such as anti-reflective coatings (ARC), are necessary to reduce optical reflections. However, for EUVL, the reflections between a layer of photoresist and a substrate are sufficiently small that an ARC is not necessary.

Referring to FIGS. 1A-1C, a film stack 100 of the prior art is provided having a substrate 101 coated with an organic under-layer 102 and an imaged layer of photoresist 103, wherein exposed regions 104 are shown. Where the layer of photoresist 103 is a positive tone photoresist comprising a photoacid generator, exposed regions 104 are rendered soluble to positive tone developing chemistry, such as aqueous tetramethylammonium hydroxide (TMAH), upon performing a post-exposure bake. As shown in FIG. 1B, exposure of layer of photoresist 103 to a developing chemistry removes exposed regions 104 to provide openings 105. Ideally, the exposed regions 104 are developed evenly and completely to provide a bottom surface 109 of opening 105 with a width 108 and having a low LWR, as shown in FIG. 1C. Additionally, side walls 106 of opening 105 should have low line edge roughness (LER). To complete the image transfer to substrate 101, additional processing, such as an etching step, is subsequently required.

Referring to FIGS. 2A-2C, a film stack 200 of the prior art is provided having a substrate 201 coated with a layer of photoresist 203 without an organic under-layer. After exposing the layer of photoresist 203 to patterned EUV radiation, exposed regions 204 are formed. When the layer of photoresist 203 is a positive tone photoresist that comprises a photoacid generator, exposed regions 204 are rendered soluble to positive tone developing chemistry, such as aqueous TMAH, upon performing a post-exposure bake. As shown in FIG. 2B, exposure of layer of photoresist 203 to a positive-tone developing chemistry removes exposed regions 204 to provide openings 205. While side walls 206 of opening 205 do not show a substantial change in LER, the bottom surface 209 of opening 205 shows an increased LWR and incomplete development of exposed region 204 (i.e., scumming). An organic under-layer may contain a mobile acidic species that is capable of migrating into the layer of photoresist 203 and/or the under-layer may inhibit or minimize acid migration from the layer of photoresist 203. In either case, the increased LWR is presumably attributed to the absence of the organic under-layer.

Thus according to the prior art, an organic under-layer improves LWR for EUVL processing, but the organic under-layer increases processing times and adds to the cost of EUVL. As such, it would be advantageous to develop new methods of patterning substrates that overcome the issues of the prior art.

SUMMARY OF THE INVENTION

Embodiments of the invention provide a method of patterning a substrate with extreme ultraviolet (EUV) radiation comprising contacting a surface of the substrate with at least one surface modification agent that reacts with and binds to the surface of the substrate to provide a modified surface, wherein the surface modification agent has a general formula: X-L-Z, wherein X is a leaving group, L is a linkage group comprising a substituted or un-substituted carbon chain having 1 to 20 carbons, a sulfur moiety, a silicon moiety, or combinations thereof, and Z is at least one of an acid functional group, a photoactive acid generator group or a halide; forming a layer of photoresist on the modified surface of the substrate, wherein the layer of photoresist comprises one or more photoactive acid generators; and exposing the layer of photoresist to a pattern of EUV radiation.

According to another embodiment of the invention, a method of patterning a substrate with EUV radiation is provided. The method includes contacting a surface of the substrate with at least one surface modification agent that reacts with and binds to the surface of the substrate to provide a modified surface, wherein the surface modification agent has a general formula: X-L-Z, wherein X is a leaving group; L is a linkage group comprising a divalent silicon moiety having a general formula of

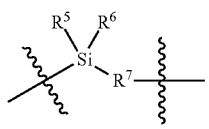

wherein $R^5$ and $R^6$ are independently a halide, an alkoxide, an alkyl, an aryl or an alkyaryl, and wherein $R^7$ is a substituted or un-substituted carbon chain having 1 to 20 carbons and is covalently bonded to silicon and to Z; and wherein Z is at least one of an acid functional group, a photoactive acid generator group or a halide; forming a layer of photoresist on the modified surface of the substrate, wherein the layer of photoresist comprises one or more photoactive acid generators; and exposing the layer of photoresist to a pattern of EUV radiation.

According to yet another embodiment of the invention, a method of patterning a substrate with EUV radiation is provided. The method comprises contacting a surface of the substrate with at least one surface modification agent that reacts with and is bound to the surface of the substrate to provide a modified surface, wherein the surface modification agent has a general formula: $Cl_3Si$—$R^7$—Z, wherein $R^7$ is a substituted or un-substituted carbon chain having 1 to 20 carbons and is covalently bonded to silicon and to Z; and wherein Z is a photoactive acid generator group or a halide; forming a layer of photoresist on the modified surface of the substrate, wherein the layer of photoresist comprises one or more photoactive acid generators; and exposing the layer of photoresist to a pattern of EUV radiation.

BRIEF DESCRIPTION OF THE DRAWINGS

Embodiments of the invention will be further appreciated in light of the following detailed description and drawings in which.

DETAILED DESCRIPTION OF THE INVENTION

A method for patterning a substrate is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Further, the use of the terms, "agent" or "agents" herein should be considered to be synonymous with the terms, "reagent" or "reagents," unless otherwise indicated. Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 3:
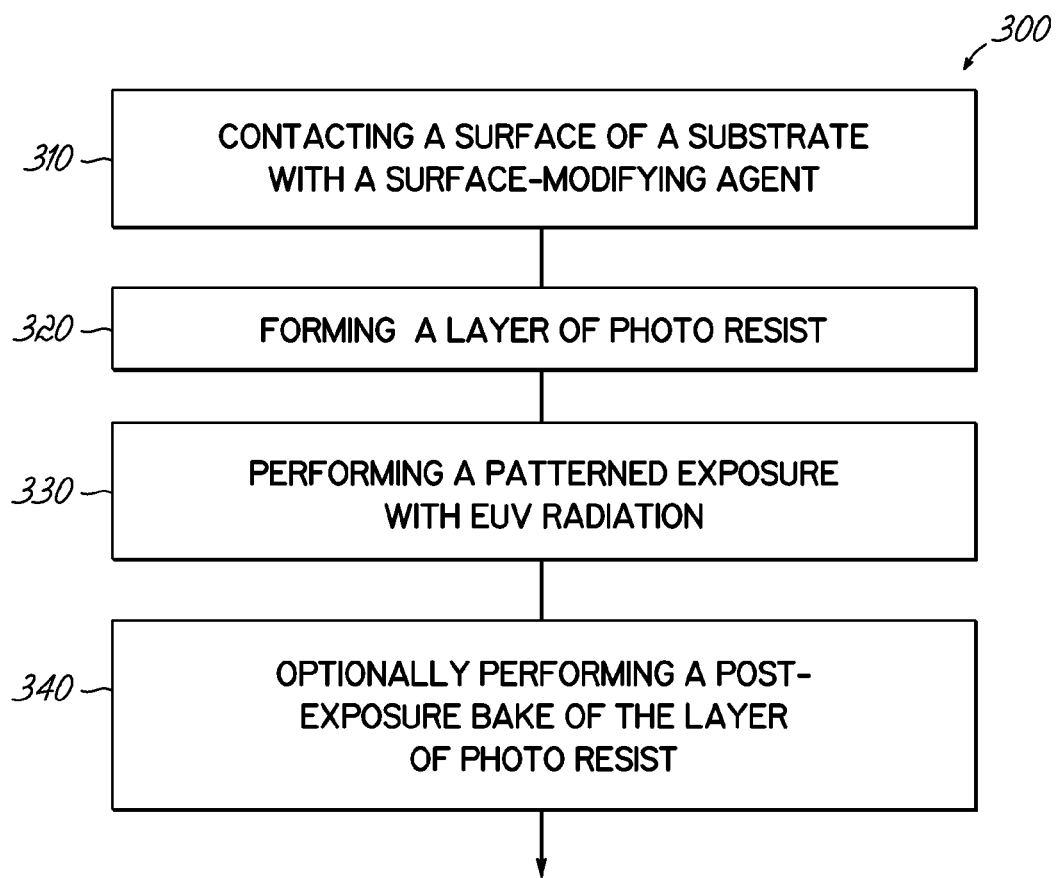
FIG. 3 provides a schematic illustration of a method for patterning a substrate according to embodiments of the present invention.

In reference to FIG. 3, chart 300 provides methods of patterning a substrate with extreme ultraviolet (EUV) radiation. The methods begin in step 310 with contacting a surface of the substrate with at least one surface modification agent, followed in step 320 by forming a layer of photoresist on the modified surface of the substrate. In step 330, the layer of photoresist is exposed to a pattern of EUV radiation. In optional step 340, the method includes a post-exposure bake of the patterned layer of photoresist. The substrate is then further processed according to methods common in the art of lithography, for example, by developing the layer of photoresist with a basic developing solution.

Accordingly, and with further reference to the schematic illustrations of FIGS. 4A-4D, in 310 the surface 402 of a substrate 401 is contacted with at least one surface modification agent 404 to form a modified surface 406. A layer of photoresist 408 is then formed on the modified surface 406. Broadly speaking, a "substrate" as described herein includes any suitable composition having functional groups F, such as hydroxyl groups, on the surface 402 of the substrate 401 that are reactive toward surface modification agents 404 according to the present invention. According to embodiments of the invention, suitable substrates 401 non-exclusively include semiconductor materials such as gallium arsenide ("GaAs"), silicon and compositions containing silicon such as crystalline silicon, polysilicon, amorphous silicon, epitaxial silicon, and silicon dioxide ("$SiO_2$") and mixtures thereof. Additional substrates 401 suitable for the present invention include metal, oxide, nitride or oxynitride. For example, substrates 401 may include silica, silicon nitride, titanium nitride, tantalum nitride, aluminum, aluminum alloys, copper, copper alloys, tantalum, tungsten and silicon oxynitride.

The substrate 401 may comprise a film stack having one or more thin films. Each thin film may comprise a conductive layer, a non-conductive layer, or a semi-conductive layer. For instance, the thin film may include a material layer comprising a metal, metal oxide, metal nitride, metal oxynitride, metal silicate, metal silicide, silicon, poly-crystalline silicon (poly-silicon), doped silicon, silicon dioxide, silicon nitride, silicon carbide, silicon oxynitride, etc. Additionally, for instance, the thin film may comprise a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the thin film may have a dielectric constant of less than 3.7, or a dielectric constant ranging from 1.6 to 3.7.

Functional groups F, such as hydroxyl groups, on the surface 402 (i.e., the un-reacted surface) of the substrate 401 are available and are reactive toward surface modification agents 404. Accordingly, upon contacting the surface 402 of the substrate 401 with a surface modification agent 404, many of the available functional groups F may react with the surface modification agent 404 to form a modified surface 406. Moreover, basic sites or impurities that may also affect the imaging and/or developing of the layer of photoresist 408 may also react with the surface modification agent 404.

Furthermore, the surface modification agents 404 may render the modified surface 406 less polarizable and non-hygroscopic relative to the unmodified surface 402, which is favorable for enhancing the adhesion of the layer of photoresist 408 and decreasing the surface energy of the substrate 401. While so-called adhesion promoters, such as hexamethyldisilazane (HMDS), are commonly used to treat substrate surfaces, an HMDS treatment alone is insufficient to off-set the negative effect on LWR presumably attributed to the absence of the organic under-layer.

It may be further appreciated that the surface modification agent 404 may also modify the surface energy of the substrate 401, such that the modified surface 406 minimizes or prevents acid diffusion out of the exposed region 409 of the imaged photoresist layer 408 and into the substrate 401. This inhibition of acid migration thereby renders the acid available during the post-exposure bake to catalyze the deprotection reaction of the photoresist material that renders the resist matrix polymer soluble in aqueous alkaline developers, as discussed further below.

In view thereof, and in accordance with the present invention, a surface modification agent 404 reacts with and binds to the surface 402 of the substrate 401 to provide a modified surface 406. According to embodiments of the invention, the surface modification agent 404 has a general formula: X-L-Z, wherein X is a leaving group; L is a linkage group comprising a substituted or un-substituted carbon chain having 1 to 20 carbons, a sulfur moiety, a silicon moiety, or combinations thereof; and Z is at least one of an acid functional group, a photoactive acid generator group or a halide.

Figure 4A:
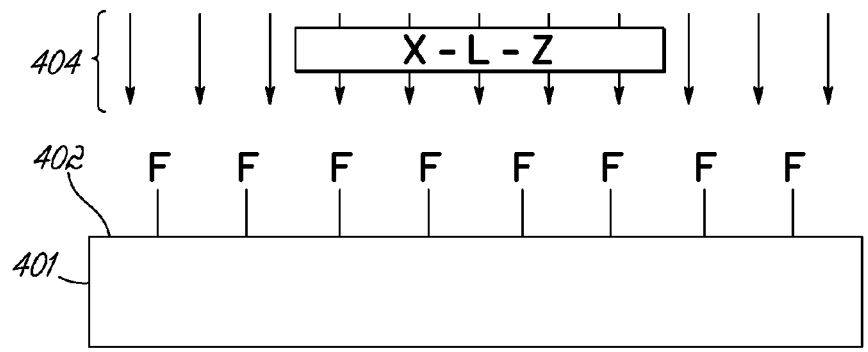
FIGS. 4A-4D illustrate a lithographic patterning technique utilizing a surface modification agent according to embodiments of the present invention.
Figure 4B:
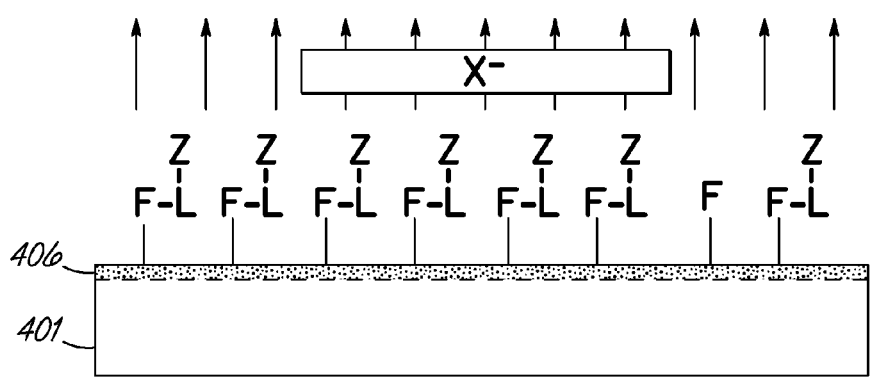

As used herein, "leaving group" is defined as a substituent which may be displaced by the functional group F and may carry a negative charge ($X^-$), as shown in FIG. 4B. It should be understood that the reactive functional group F on the surface 402 of the substrate 401 may provide an available proton upon reacting with the surface modification agent 404, so that the leaving group X may depart in a protonated form (HX). According to some embodiments of the invention, the leaving group X may include a halide, OR, or $NR^1R^2$, wherein R, $R^1$ and $R^2$ are independently alkyl, aryl, alkaryl, acyl or sulfonyl, which in protonated form correspond to hydrogen halides, alcohols, phenols, carboxylic acids, sulfonic acids, amines, amides and the like. Accordingly, the leaving group may be an alkoxide, a carboxylate, a sulfonate or $NR^3R^4$, wherein $R^3$ and $R^4$ are independently alkyl, aryl, or alkaryl.

According to embodiments of the invention, L is a linkage group for connecting the surface 402 of the substrate 401 to the group Z, which will be discussed further below. The leaving group X is chemically-bonded to L, which may be a substituted or un-substituted carbon chain having 1 to 20 carbons, a sulfur moiety, a silicon moiety, or a combination thereof. In one embodiment, L may be a sulfur moiety, such as a sulfinyl or sulfuryl moiety. In another embodiment, L may be a silicon moiety having a formula of

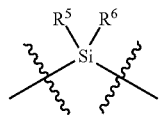

wherein $R^5$ and $R^6$ are independently halide, alkoxide, carboxylate, alkyl, aryl or alkaryl. Upon reaction, the leaving group X is displaced and the linkage group binds to the functional group F thereby linking the group Z to the substrate 401 to provide the modified surface 406, as shown schematically in FIG. 4B.

Thus, simply by way of example, the linkage groups may be $SO_2$, $S(O)CH_2(CH_2)_n$, $SO_2CH_2(CH_2)_n$, $SiCl_2$, $Si(CH_3)_2$, $Si(CH_3)_2CH_2(CH_2)_n$, $C(O)CH_2(CH_2)_n$, or the like. In view thereof, according to embodiments of the invention, the surface modification agent 404 may have a general formula, such as one of the following:

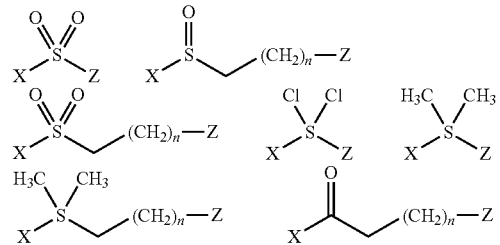

wherein X and Z are defined above, and wherein n is a number from 0 to about 19. By way of further example, in one embodiment, a surface modification agent 404 has a general formula of $R^1R^2N$—$SiCl_3$, wherein $R^1$ and $R^2$ are both alkyl. In yet another embodiment, the surface modification agent 404 may be $(H_3C)_2N$—$SiCl_3$.

According to embodiments of the invention, Z may be an acid functional group. For example, the acid functional group may comprise a carboxyl group, a sulfonyl group, a sulfinyl group, a phosphoryl group, or a phosphonyl group. Accordingly, in some embodiments the acid functional group is selected from the group consisting of a carboxylic acid, a sulfonic acid, a sulfinic acid, a phosphoric acid, and a phosphonic acid.

According to other embodiments of the invention, Z may be a photoactive acid generator (PAG) group. As used herein, PAG is a photosensitive group that produces an acid upon exposure to the appropriate radiation. The PAG group may include onium salts, such as diazonium salts, iodonium salts, or sulfonium salts; or non-ionic species, such as diazosulfonyl compounds, sulfonyloxy imides, or nitrobenzyl sulfonate esters. In view thereof, according to embodiments of the invention, the surface modification agent 404 may be defined by a general formula X-L-PAG, wherein X, L and PAG are defined above. For example, the surface modification agent 404 may have a general formula X—$SO_2$-PAG, X—$S(O)CH_2(CH_2)_n$-PAG, X—$SO_2CH_2(CH_2)_n$-PAG, X—$SiCl_2$-PAG, X—$Si(CH_3)_2$-PAG, X—$Si(CH_3)_2CH_2(CH_2)_n$-PAG, or X—$C(O)CH_2(CH_2)_n$-PAG.

Thus, according to some embodiments, the PAG group may be an iodonium salt, which may include, but is not limited to, diphenyliodonium trifluoromethane sulfonate, diphenyliodonium nonafluorobutane sulfonate, diphenyliodonium hexafluorophosphate, (4-methoxyphenyl)phenyliodoniumtrifluoromethane sulfonate, bis(p-tert-butylphenyl) iodonium trifluoromethanesulfonate, bis(4-tert-butylphenyl) iodonium nonaflate, diphenyl iodonium triflate, diphenyl iodonium antimonate, methoxy diphenyl iodonium triflate, di-t-butyl diphenyl iodonium triflate, 4-tert-butoxyphenylphenyliodonium, 4-methoxyphenylphenyliodonium, diphenyl iodonium nonaflate, methoxy diphenyl iodonium nonaflate, di-t-butyl diphenyl iodonium nonaflate, tetrakis(pentafluorophenyl)borate-4-methylphenyl[4-(1-methylethyl)phenyl]iodonium (DPI-TPFPB), bis(4-tert-butylphenyl)iodonium triflate (DTBPI-Tf), diphenyl iodonium perfluorooctane sulfonate, methoxy diphenyl iodonium perfluorooctane sulfonate, or Rhodosil™ Photoinitiator 2074 (FABA), and combinations thereof.

According to other embodiments, the PAG group may be an sulphonium salt, which may include, but is not limited to, triphenylsulfonium trifluoromethane sulfonate, triphenylsulfonium nonafluorobutane sulfonate, triphenylsulfonium hexafluorophosphate, (4-methoxyphenyl)diphenylsulfonium trifluoromethanesulfonate, and (p-tert-butylphenyl)diphenylsulfonium trifluoromethanesulfonate, tris(4-t-butylphenyl)sulfonium tetrakis-(pentafluorophenyl)borate (TTBPS-TPFPB), tris(4-t-butylphenyl)sulfonium hexafluorophosphate (TTBPS-HFP), triphenylsulfonium triflate (TPS-Tf), triphenylsulfonium hexafluoroantimonate (TPS-103), triphenylsulfonium bis(perfluoromethanesulfonyl)imide (TPS-N1), triphenylsulfonium bis(perfluoroethanesulfonyl)imide (TPS-N2), triphenylsulfonium bis(perfluorobutanesulfonyl)imide (TPS-N3), or triphenylsulfonium tris(perfluoromethanesulfonyl)methide (TPS-C1), and combinations thereof.

According to other embodiments, the PAG group may be a nonionic PAG, which may include, but is not limited to, ethanone, 1,1'-[1,3-propanediylbis(oxy-4,1-phenylene)]bis[2,2,2-trifluoro-, bis[O-(propylsulfonyl)oxime] (CGI 263), ethanone, 1,1'-[1,3-toluenediylbis(oxy-4,1-phenylene)]bis[2,2,2-trifluoro-, bis[O-(propylsulfonyl)oxime] (CGI 268), (5-propanesulfonyloxyimino-5H-thiophen-2-ylidene)-2-methylphenyl acetonitrile (CGI 1311), (5-octanesulfonyloxyimino-5H-thiophen-2-ylidene)-2-methylphenyl acetonitrile (CGI 1325), (5-toluenesulfonyloxyimino-5H-thiophen-2-ylidene)-2-methylphenyl acetonitrile (CGI 1397), or triazine (TAZ-101), and combinations thereof.

According to other embodiments of the invention, Z may be a halide. Halides include fluoride, chloride, bromide, and iodide. Without being bound to any particular theory, it is commonly understood that EUV interactions with molecular structures produce photoelectrons and secondary electrons. Halides are known to enhance the capture or sensitivity to secondary electron exposure, which correspondingly provides for higher production of acid. For example, where the halide is iodide (I), the surface modification agent 404 may have a general formula X—$SO_2$—I, X—$S(O)CH_2(CH_2)_n$—I, X—$SO_2CH_2(CH_2)_n$—I, X—$SiCl_2$—I, X—$Si(CH_3)_2$—I, X—$Si(CH_3)_2CH_2(CH_2)_n$—I, or X—$C(O)CH_2(CH_2)_n$—I.

According to embodiments of the invention, contacting the surface 402 of a substrate 401 with a surface modification agent 404 may be conducted using either a vapor phase or a liquid phase surface modification agent, as desired. For example, the contacting may be accomplished by spin coating, spray coating or vapor deposition.

Further, the contacting methods are optionally conducted in the presence of a solvent or co-solvent, and it should be appreciated that when the surface modification is to be conducted in the liquid phase, the solvent or co-solvent will dissolve the surface modification agent 404 without significantly dissolving the substrate or film to be treated. Any suitable material may be employed as a solvent or co-solvent. For example, the solvent or co-solvent may be selected from the group consisting of ethers, esters, hydrocarbons, ketones, glycol ethers, chlorinated solvents, low viscosity siloxanes and suitable combinations thereof.

Exemplary ethers include diethyl ether, diisopropyl ether, dibutyl ether and combinations thereof. Exemplary esters include ethyl acetate, isopropyl acetate, n-butyl acetate, and combinations thereof. Exemplary hydrocarbons include n-hexane, n-heptane, cyclohexanes, toluene, and combinations thereof. Exemplary ketones include acetone, 3-pentanone, methyl ethyl ketone, methyl isobutyl ketone, and combinations thereof. Exemplary glycol ethers include tri(ethylene glycol)dimethyl ether, tetra(ethylene glycol)dimethyl ether, tri(propylene glycol)dimethyl ether, and combinations thereof. Exemplary chlorinated solvents include 1,2-dichloroethane, carbon tetrachloride, chloroform, and combinations thereof. Suitable solvents/co-solvents can be employed in concentrations ranging generally from about 0.5 to about 50 percent, or greater, by weight of the total solution.

The duration of contacting the surface 402 of the substrate 401 with the surface modification agent 404 may vary according to the reactivity between the surface 402 of the substrate 401 and the surface modifying agent 404, and the reacting environment. Accordingly, a surface modification reaction may be conducted for a time period sufficient at a sufficient temperature to achieve the desired amount of surface modification. By way of example and without limitation, the surface modification reaction may be conducted for about 10 seconds to about 1 hour, at a temperature within the range of about 10° C. to about 100° C., and at a pressure within the range of about 0.1 psi to about 200 psi.

After the surface modification agent 404 has been applied to the surface 402 of the substrate 401 by art-standard methods, such as spinning on, spraying on or vapor depositing, the substrate 401 maybe heated to a temperature and for a time period sufficient to drive off any remaining surface modification agent 404 and/or co-solvent. Optionally, the surface modification agent 404 may be applied in several applications.

According to one embodiment, the surface 402 of the substrate 401 may be modified by contacting the surface 402 with more than one surface modification agent (not shown). For example, a first and a second surface modification agent may be applied to the substrate 401, wherein the first and the second modification agent are different. Accordingly, a method may include contacting with a first surface modification agent, which is subsequently followed by contacting the surface with a second surface modification agent. Optionally, the surface modification agent treatment(s) of the substrate may be accompanied by a separate hexamethydisilazane (HMDS) treatment.

Figure 4C:
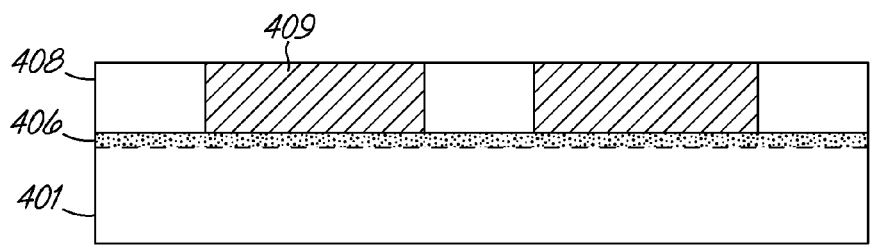

In step 320, a layer of photoresist 408 is formed, as shown in FIG. 4C. The layer of photoresist 408 may be applied to the modified surface 406 of the substrate 401 by any means commonly-used in the art. Thereafter, the applied layer of photoresist 408 maybe heated to a temperature and for a time period sufficient to drive off any remaining solvent and/or co-solvent.

According to embodiments of the invention, the layer of photoresist 408 is a EUV photoresist. Accordingly, the layer of photoresist 408 may comprise any suitable resist matrix polymer, such as poly(hydroxystyrene)-based resist or a (meth)acrylate-based resist, that is protected with acid labile groups. Additionally, the layer of photoresist 408 comprises one or more photoactive acid generators.

In step 330, the layer of photoresist 408 is exposed to a pattern of EUV radiation, wherein the one or more photoactive acid generators produce acid. The imaged layer of photoresist 408 then includes exposed regions 409, as shown in FIG. 4C.

In step 340, an optional post-exposure bake is performed. The presence of acid during the post-exposure bake serves to catalyze the deprotection reaction of the photoresist material that renders the resist matrix polymer soluble in aqueous alkaline developers. According to embodiments of the invention, upon exposing the layer of photoresist 408 to EUV radiation and performing a post-exposure bake following the exposing, the layer of photoresist 408 undergoes acid-catalyzed deprotection. According to yet another embodiment, the layer of photoresist 408 comprises a material that switches solubility due to a change in polarity upon performing an exposure to EUV radiation and optionally, performing a post-exposure bake following the exposure.

The imaged layer of photoresist 408 is thereafter developed according to methods standard to the art. For example, the imaged layer of photoresist 408 may be contacted with a developing solution to remove exposed regions 409 to provide openings 410 characterized by acceptable line edge roughness (LER) as represented by smooth side wall 412 and uniform opening width 416. Suitable developers include those commonly used in the art, such as aqueous alkaline developers that contain tetramethylammonium hydroxide (TMAH).

Figure 1A:
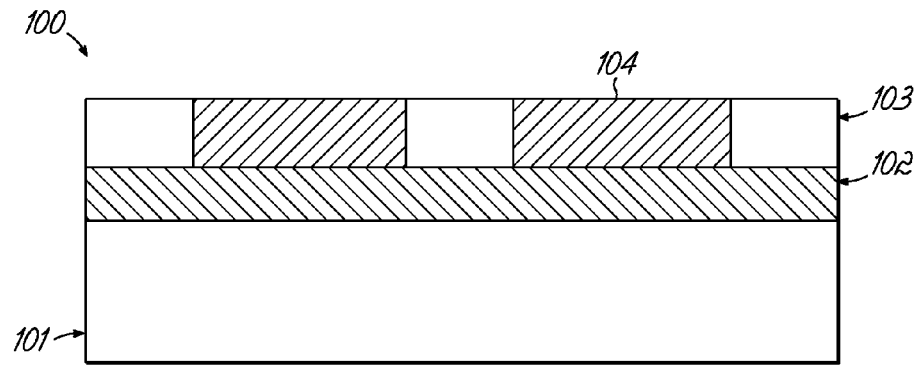
FIGS. 1A-1C illustrate a lithographic patterning technique utilizing an antireflective coating and a photoresist according to the prior art.
Figure 1B:
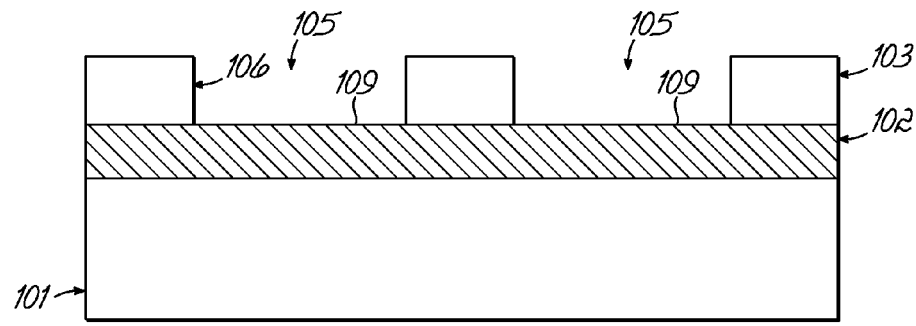
Figure 1C:
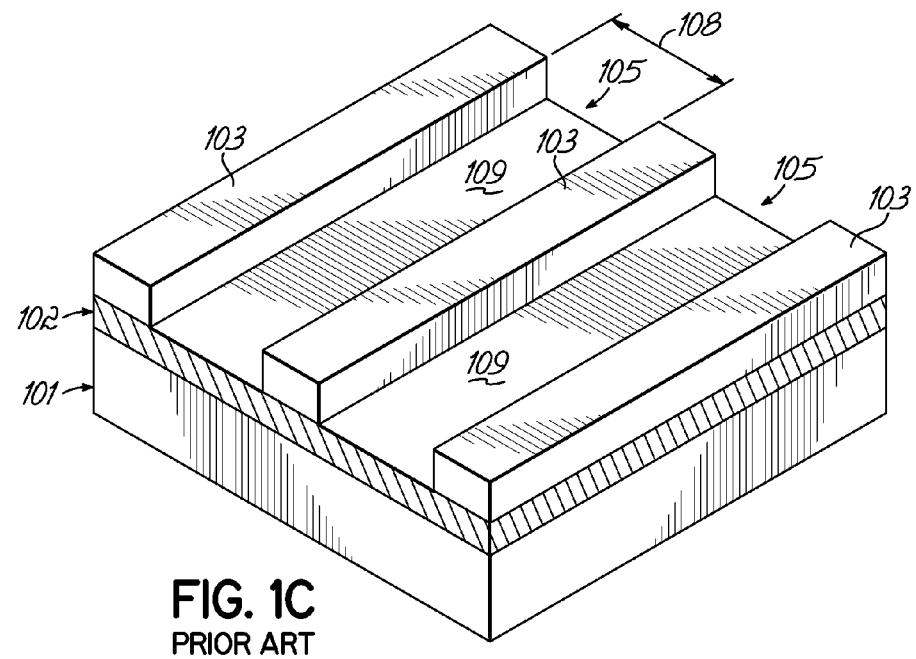
Figure 2A:
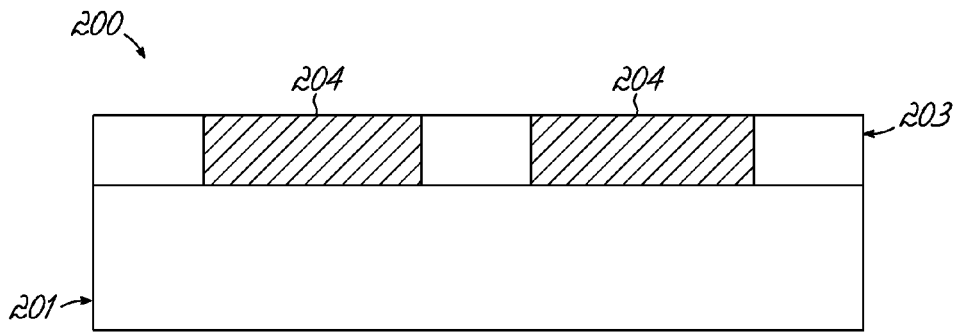
FIGS. 2A-2C illustrate a lithographic patterning technique utilizing a photoresist without an antireflective coating according to the prior art.
Figure 2B:
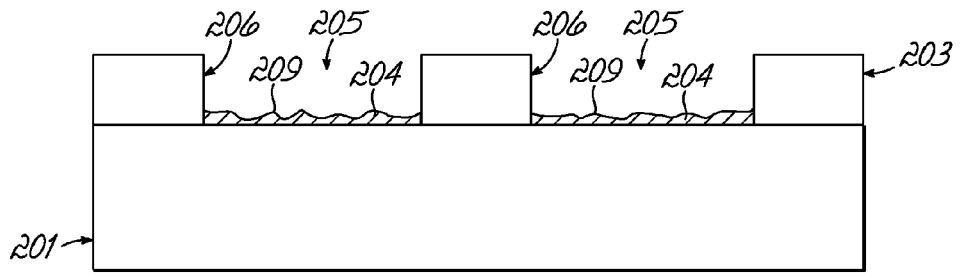
Figure 2C:
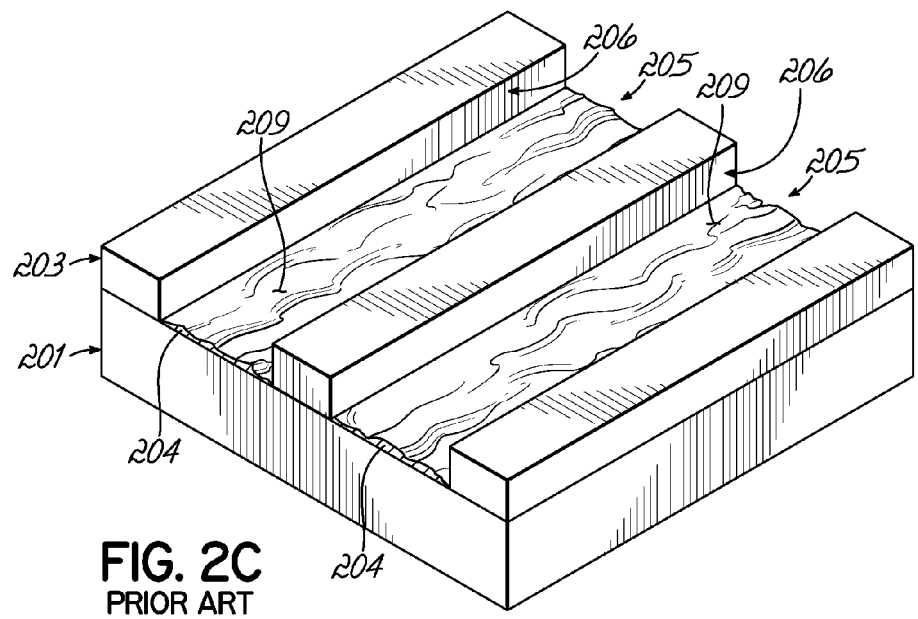
Figure 4D:
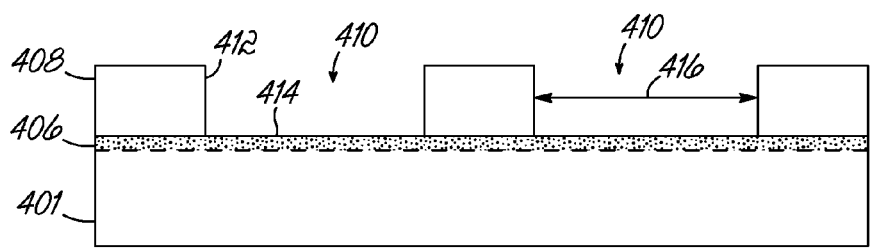

Further, as shown in FIG. 4D, the development of the imaged regions 409 provides openings 410 having an acceptable line width roughness (LWR) as represented by the smooth opening surface 414. Moreover, the openings 410 are not characterized by the incomplete development of the imaged region 409, as was shown in the prior art FIG. 2C.

And thus in accordance with the foregoing described embodiments, there is provided a method of patterning a substrate with EUV radiation without the presence of an anti-reflective coating (or other deposited under-layer) to provide a patterned substrate having acceptably low LWR. The foregoing embodiments enable the elimination of the anti-reflective coating by modifying the substrate surface with a surface modifying agent. The surface modification agent thereby provides an acid, acid generator or halide at the surface of the substrate that improves the imaging and/or developing processes, while presumably eliminating basic sites and/or impurities that may detrimentally affect the imaging and/or developing of the layer of photoresist.

While only certain embodiments of this invention have been described in detail above, those skilled in the art will readily appreciate that many modifications are possible in the embodiments without materially departing from the novel teachings and advantages of this invention. The invention in its broader aspects is therefore not limited to the specific details, representative apparatus and method, and illustrative examples shown and described. Accordingly, departures may be made from such details without departing from the scope of the general inventive concept.

What is claimed is:

1. A method of patterning a substrate with extreme ultraviolet (EUV) radiation comprising:
   contacting a surface of said substrate with at least one surface modification agent that reacts with and binds to said surface of said substrate to provide a modified surface, wherein said surface modification agent has a general formula:
   X-L-Z, wherein X is a leaving group, L is a linkage group comprising a silicon moiety and Z is at least one of an acid functional group, a photoactive acid generator group or a halide;
   forming a layer of photoresist on said modified surface of said substrate, wherein said layer of photoresist comprises one or more photoactive acid generators; and
   exposing said layer of photoresist to a pattern of EUV radiation.

2. The method of claim 1, wherein said contacting said surface of said substrate with at least one surface modification agent comprises
   contacting said surface with a first surface modification agent to provide the modified surface, and
   contacting said modified surface with a second surface modification agent, wherein said first and said second surface modification agents are different.

3. The method of claim 1, further comprising performing at least one post-exposure bake of said layer of photoresist.

4. The method of claim 3, further comprising developing said pattern in said layer of photoresist.

5. The method of claim 1, wherein said contacting is selected from the group consisting of spin coating, spray coating and vapor deposition.

6. The method of claim 1, wherein said leaving group X is selected from the group consisting of a halide, OR, and $NR^1R^2$, wherein R, $R^1$ and $R^2$ are independently alkyl, aryl, alkaryl, acyl or sulfonyl.

7. The method of claim 1, wherein said leaving group X is selected from the group consisting of an alkoxide, a carboxylate, a sulfonate and $NR^3R^4$, wherein $R^3$ and $R^4$ are independently alkyl, aryl, or alkaryl.

8. The method of claim 1, wherein said acid functional group is selected from the group consisting of carboxyl, sulfonyl, sulfinyl, phosphoryl, and phosphonyl.

9. The method of claim 1, wherein said photoactive acid generator group comprises a sulfonium salt, an iodonium salt, a dicarboximidyl salt, a diazonium salt or a non-ionic group.

10. The method of claim 1, wherein said linkage group L further comprises a substituted or un-substituted carbon chain having 1 to 20 carbons.

11. The method of claim 1, wherein said silicon moiety has a formula of

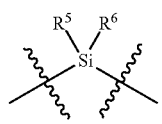

wherein $R^5$ and $R^6$ are independently halide, alkoxide, carboxylate, alkyl, aryl or alkyaryl.

12. The method of claim 11, wherein said silicon moiety has a formula of $SiCl_2$.

13. The method of claim 1, wherein said surface modification agent is $R^1R^2N$—$SiCl_3$, wherein $R^1$ and $R^2$ are independently alkyl, aryl, alkaryl, acyl or sulfonyl.

14. The method of claim 13, wherein $R^1$ and $R^2$ are alkyl.

15. A method of patterning a substrate with extreme ultraviolet (EUV) radiation comprising:
contacting a surface of said substrate with at least one surface modification agent that reacts with and binds to said surface of said substrate to provide a modified surface, wherein said surface modification agent has a general formula:
X-L-Z, wherein X is a leaving group; L is a linkage group comprising a divalent silicon moiety having a general formula of

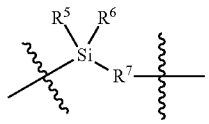

wherein $R^5$ and $R^6$ are independently a halide, an alkoxide, an alkyl, an aryl or an alkyaryl, and wherein $R^7$ is a substituted or un-substituted carbon chain having 1 to 20 carbons and is covalently bonded to silicon and to Z; and wherein Z is at least one of an acid functional group, a photoactive acid generator group or a halide;
forming a layer of photoresist on said modified surface of said substrate, wherein said layer of photoresist comprises one or more photoactive acid generators; and
exposing said layer of photoresist to a pattern of EUV radiation.

16. The method of claim 15, wherein said leaving group X is $NR^1R^2$, wherein $R^1$, $R^2$, $R^5$, and $R^6$ are alkyl; and wherein Z is a photoactive acid generator group.

17. The method of claim 15, wherein said leaving group X, $R^5$, and $R^6$ are halides.

18. The method of claim 17, wherein the halide is chloride, and wherein Z is a photoactive acid generator group or a halide.

19. The method of claim 18, wherein Z is a photoactive acid generator group.

20. A method of patterning a substrate with extreme ultraviolet (EUV) radiation comprising:
contacting a surface of said substrate with at least one surface modification agent that reacts with and binds to said surface of said substrate to provide a modified surface, wherein said surface modification agent has a general formula:
X-L-Z, wherein X is a halide, L is a linkage group comprising a silicon moiety, and Z is a photoactive acid generator group;
forming a layer of photoresist on said modified surface of said substrate, wherein said layer of photoresist comprises one or more photoactive acid generators; and
exposing said layer of photoresist to a pattern of EUV radiation.

* * * * *